(12) United States Patent
Gallatin et al.

(10) Patent No.: US 7,287,239 B2
(45) Date of Patent: Oct. 23, 2007

(54) PERFORMANCE IN MODEL-BASED OPC ENGINE UTILIZING EFFICIENT POLYGON PINNING METHOD

(75) Inventors: Gregg M. Gallatin, Newtown, CT (US); Emanuel Gofman, Haifa (IL); Kafai Lai, Poughkeepsie, NY (US); Mark A. Lavin, Katonah, NY (US); Maharaj Mukherjee, Wappingers Falls, NY (US); Dov Ramm, Menashe (IL); Alan E. Rosenbluth, Yorktown Heights, NY (US); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 716 days.

(21) Appl. No.: 10/694,473

(22) Filed: Oct. 27, 2003

(65) Prior Publication Data

US 2005/0091014 A1    Apr. 28, 2005

(51) Int. Cl.
*G06F 17/50* (2006.01)
(52) U.S. Cl. .......................................... 716/19; 716/21
(58) Field of Classification Search ................... 716/19, 716/21; 430/5
See application file for complete search history.

(56) References Cited

U.S. PATENT DOCUMENTS

| | | | |
|---|---|---|---|
| 5,644,390 A | 7/1997 | Yasuzato | |
| 5,647,027 A | 7/1997 | Burges et al. | |
| 5,680,588 A | 10/1997 | Gortych et al. | |
| 6,127,071 A | 10/2000 | Lu | |
| 6,223,139 B1 | 4/2001 | Wong et al. | |
| 6,233,056 B1 | 5/2001 | Naulleau et al. | |
| 6,263,299 B1 | 7/2001 | Aleshin et al. | |
| 6,289,499 B1 | 9/2001 | Rieger et al. | |
| 6,303,253 B1 | 10/2001 | Lu | |
| 6,415,421 B2 | 7/2002 | Anderson et al. | |
| 6,425,113 B1 | 7/2002 | Anderson et al. | |
| 6,449,387 B1 | 9/2002 | Inui | |
| 6,453,457 B1 | 9/2002 | Pierrat et al. | |
| 6,460,997 B1 | 10/2002 | Frey et al. | |
| 6,487,696 B1 | 11/2002 | Gudmundsson et al. | |
| 2002/0062206 A1 | 5/2002 | Liebchen | |
| 2002/0126267 A1 | 9/2002 | Smith | |
| 2002/0159040 A1 | 10/2002 | Hamatani et al. | |
| 2004/0133871 A1* | 7/2004 | Granik et al. | 716/19 |

* cited by examiner

*Primary Examiner*—Paul Dinh
(74) *Attorney, Agent, or Firm*—DeLio & Peterson, LLC; Kelly M. Nowak; Steven Capella

(57) ABSTRACT

Methods, and a program storage device for executing such methods, for performing model-based optical proximity correction by providing a mask matrix having a region of interest (ROI) and locating a plurality of points of interest within the mask matrix. A first polygon having a number of vertices representative of the located points of interest is computed, followed by determining a spatial relation between its vertices and the ROI. The vertices of the first polygon are then pinned to boundaries of and within the ROI such that a second polygon is formed on the ROI. The process is repeated for all vertices of the first polygon such that the second polygon is collapsed onto the ROI. This collapsed second polygon is then used to correct for optical proximity.

25 Claims, 7 Drawing Sheets

PERFORMANCE IN MODEL-BASED OPC ENGINE UTILIZING EFFICIENT POLYGON PINNING METHOD

CROSS-REFERENCE TO RELATED APPLICATIONS

The present application is related to commonly assigned U.S. Pat. No. 7,010,776, titled "EXTENDING THE RANGE OF LITHOGRAPHIC SIMULATION INTEGRALS", U.S. patent application Ser. No. 10/694,465, titled "INCORPORATION OF A PHASE MAP INTO FAST MODEL-BASED OPTICAL PROXIMITY CORRECTION SIMULATION KERNELS TO ACCOUNT FOR NEAR AND MID-RANGE FLARE", U.S. Pat. No. 7,055,126, titled "RENESTING INTERACTION MAP INTO DESIGN FOR EFFICIENT LONG RANGE CALCULATION", and U.S. patent application Ser. No. 10/694,299, titled "SIMULTANEOUS COMPUTATION OF MULTIPLE POINTS ON ONE OR MULTIPLE CUT LINES", filed on even date herewith, which are hereby incorporated by reference herein in their entirety.

BACKGROUND OF THE INVENTION

1. Field of the Invention

This invention relates generally to the field of optical lithography, and in particular, to a polygon pinning methodology of forming new vertices of original polygons and pinning such vertices to the Region of Interest (ROI) for use in model-based Optical Proximity Correction (OPC) for optical lithography.

2. Description of Related Art

In the fabrication of semiconductor devices, optical micro lithography processing, also known as photolithography, generally requires duplicating desired circuit patterns as best as possible onto a semiconductor wafer. These desired circuit patterns are represented as opaque and completely or partially transparent regions on a template referred to as a photomask. The patterns on the photomask are then projected onto photoresist-coated wafers by way of optical imaging through an exposure system.

Aerial image simulators, which compute the images generated by optical projection systems, have proven to be a valuable tool to analyze and improve the state-of-the-art in optical lithography for integrated circuit fabrication. These simulations have found application in advanced mask design, such as phase shifting mask (POM) design, optical proximity correction (OPC), and in the design of projection optics. Modeling aerial images is a crucial component of semiconductor manufacturing. Since present lithographic tools employ partially coherent illumination, such modeling is computationally intensive for all but elementary patterns. The aerial image produced by the mask, i.e., the light intensity in an optical projection system's image plane, is a critically important quantity in micro lithography for governing how well a developed photoresist structure replicates a mask design.

In OPC software, the image intensity is usually calculated by a bilinear transform having a specific kernel function that describes the physics of the process. This may be accomplished by way of an optical kernel corresponding to a Hopkin's integral or a composite kernel that includes resist effects. For example, for short range effects the bilinear transform can be optimally reduced to a sum of simple linear convolutions by the Sum of Coherent Sources (SOCS) method, whereas for intermediate range effects or other non-optical effects the bilinear transform may be reduced to a linear convolution between mask pattern and an intensity kernel.

For very long-range effects, the problem can be reduced still further to represent the mask by a coarse grid wherein each pixel is an average pattern density of features within that grid-square. The convolution between the coarse grid and the incoherent kernel can be done very rapidly, e.g. via Fast Fourier transform (FFT) to gain speed since an FFT can generate convolution for all pixels at the same time, or by newer more rapid methods that provide the same benefit.

However, the short and intermediate range is a critical part that can be time consuming due to the need to address individual polygons. Normal practice for calculating short and intermediate range effects typically includes spatially truncating the kernel by some practical assumption to provide a table lookup of the convolution of basic building block sectors which is stored within a table of finite and acceptable size.

The above prior art convolution techniques are commonly performed on polygon features using either sector-based algorithms or edge-based algorithms. These sector-based algorithms, which may be calculated using sectors at a variety of angles, allow for the convolution over a sector to be pre-calculated as base-images and stored in a table or matrix. For example, conventional practice for a sector based OPC engine may include decomposing a polygon into a collection of sectors of either 90-degree angles (as shown in FIG. 1) or 45-degree angles (as shown in FIGS. 2A-B). However, conventional sector based OPC calculations are often time consuming and require a significant amount of memory as calculations are performed for each sector within the square region of interest (ROI) 10 and then stored in the tables (matrices) for later use.

In addition to the above, sector based OPC calculations also suffer from accuracy deficiencies for certain long-range kernel. That is, mathematical difficulties arise in optical proximity correction calculations that, in part, can be attributed to divergence issues when attempting to analytically express imaging kernels over the unbound sectors, of which mask polygons are conventionally decomposed.

For example, FIG. 1 depicts lookup table values for a variety of 90-degree sectors for various points "X0" inside the square ROI 10. For sectors having edges that are strictly horizontal and vertical, the table look up area (Kernel support area) is a square with sides two times the optical distance (OD). At any point "X0" inside the ROI, the table value is constant along any one of the straight contour lines 20. However, for any point "X0" 30 that resides outside ROI 10, the contour line 20 is extended outside the ROI, either horizontally or vertically, and the convolution value for such point "X0" 30 is taken at the boundary of the ROI along the same straight contour line at point "X0*" 30' as is shown. This process is commonly referred to as continuation.

Further with respect to FIG. 1, all convolution contributions of each point or vertex lying within the ROI is pre-calculated and stored in a matrix. For all other points outside the ROI that are not contributing to the polygon, e.g., those points beyond the left and bottom boundaries of the ROI, the convolution values of such points are equal to zero. The convolution of the polygon, with the kernel, is then calculated by summing the contributions of each contributing pre-calculated, stored sector lying within the ROI.

In another example of conventional sector based OPC calculations, FIGS. 2A and 2B illustrate lookup table values for 45-degree sectors. As shown, for sectors with 45-degree angles the continued contour at the upper half is now not vertical but is skewed laterally, having a 45-degree slope in the upper region and a constant value across the contour line. This laterally skewed contour is applicable to ortho-45 designs.

Accordingly, when point "X0" 30 lies above the ROI 10, the value will now be taken at point "X0*" 30' that lies on the boundary of ROI and along the same laterally skewed contour line. Similarly, at any point "X0" inside the ROI, the table value is constant along any one of the laterally skewed 45-degree sectors. Convolutions at each 45-degree sector vertex are calculated and stored in a matrix for all points "X0" within the ROI. For ease of lookup for any point "X0" lying outside the ROI 10 of FIG. 2B, the top half of the table lookup area is skewed in the same lateral direction as the 45-degree contour lines.

However, in so doing, a disadvantage is that any points lying outside the radius relative to the vertex of the skewed ROI 10', as is depicted by the arrow in FIG. 2B, are outside of the pre-calculated matrix, and therefore, will not add any contribution to convolution of the polygon. As such, conventional practice is to extend the skewed ROI 10' by a distance of $(1 - 1/\sqrt{2})$ ROI on all 4 sides of the table by this amount to provide an extended ROI 15. This creates an appreciably larger lookup table, i.e., ROI 15, for which convolution contribution at points "X0" along each 45-degree sector must be pre-calculated and stored in the matrix. The larger lookup table ROI 15 is undesirable, as it requires even more time and memory to calculate all the contributing convolution vertices of the polygon within ROI 15, in addition to requiring increased amounts of memory for storage thereof. Further, this approach is undesirable as the skewed lookup table must be subsequently transformed to a square matrix for computer implementation, therein requiring a coordinate transformation for every vertex.

Polygon cropping procedures are also used to form multiple polygons representative of vertices of an original polygon(s), whereby the vertices of each of these multiple new polygons is subsequently pinned to the ROI. One such method is referred to as the Intersection Method. This involves generating multiple cropped polygons of an original polygon(s) using the algorithm C=A∪B, wherein shape A is a polygon, shape B is the ROI and intersections C is the generation of multiple new, smaller polygons. Unfortunately, since many levels and varieties of data structures of polygons and complicated hierarchy are created, this introduces numerous allocation steps into the procedure, which requires a significant amount of memory, as well as involves large amounts of numerical and topological overhead in creating these multiple polygons. As a result, cropping procedures also require a substantial amount of overhead in processing time since usually a full chip correction is required. Another disadvantage of common cropping procedures is that they often introduce numerical instability into the procedure due to numerical error in formation of new multiple polygons representative of vertices of the original polygon(s) and as a result of the change of shape of the chip topology, which in turn, leads to altering polarity of the original polygon(s).

Consequently, a need exists in the art for providing improved methods of convoluting polygons within a ROI for use in Optical Proximity Correction for optical lithography.

The present invention overcomes the above problems and deficiencies in the prior art by providing an improved polygon pinning method that accurately, efficiently, easily and cost effectively creates new vertices of the located polygons within a ROI and pins such vertices to the ROI by a unique algorithm for use in model-based OPC calculations.

SUMMARY OF THE INVENTION

Bearing in mind the problems and deficiencies of the prior art, it is therefore an object of the present invention to provide an improved polygon pinning method that creates new vertices of the located polygons within a ROI and pins such vertices to the ROI by collapsing the same using a unique algorithm for use in OPC calculations.

It is another object of the present invention to provide a polygon pinning method that accurately, efficiently, easily and cost effectively convolutes polygons within a region of interest.

A further object of the invention is to provide a polygon pinning method that reduces the number of data structures and the numerical overhead in a sector based OPC calculation.

Another object of the invention is to provide a polygon pinning method that saves computation time by increasing the rate of convolving polygons within a ROI.

Still another object of the invention is to provide a polygon pinning method that reduces the amount of memory required to perform polygon convolution calculations in OPC calculations.

It is yet another object of the present invention to provide a polygon pinning method that avoids the creation of numerous smaller polygons having vertices representative of those polygons located with a ROI.

Another object of the invention is to provide a polygon pinning method that improves numerical stability in OPC calculations.

Still other objects and advantages of the invention will in part be obvious and will in part be apparent from the specification.

The above and other objects, which will be apparent to those skilled in art, are achieved in the present invention, which, is directed to in a first aspect a method for performing model-based optical proximity correction. The method includes providing a mask matrix having a region of interest (ROI) with a boundary. A plurality of points of interest are located within the mask matrix and then a first single loop finite geometrical shape is determined such that it has a plurality of vertices representative of the located plurality of points of interest. This first single loop finite geometrical shape is then collapsed onto the ROI to correct for optical proximity. In so doing, a second collapsed single loop finite geometrical shape is formed on the ROI by pinning those vertices of the first single loop finite geometrical shape residing outside the ROI to the boundary of the ROI.

In accordance with this aspect, the first and second single loop finite geometrical shapes may have identical or different finite geometrical shapes, as well as an identical or a different number of vertices. The first single loop finite geometrical shape is preferably computed based on a correlation between the plurality of points of interest and the region of interest.

In the steps of collapsing the computed first single loop finite geometrical shape, first and second adjacent vertices of such loop are located and then locations of these vertices are determined within the matrix in relation to the region of interest. In so doing, wherein the locations of these first and second vertices are within the ROI, the first of such vertices is assigned to a first vertex of the second single loop finite geometrical shape within the ROI, and then the process repeated for all remaining vertices of the first single loop finite geometrical shape.

Alternatively, wherein the first vertex resides within and the second vertex resides outside the ROI, the second vertex is pinned to a closest point of intersection with the boundary of the ROI. The first vertex is then assigned to a first vertex of said second single loop finite geometrical shape within said ROI and the second pinned vertex is then assigned to a second vertex of the second single loop finite geometrical shape within the ROI. The process is then repeated for all remaining vertices of the first single loop finite geometrical shape.

In another alternative, wherein the first vertex resides outside and the second vertex resides within the ROI, the first vertex is pinned to a closest point of intersection with the boundary of the ROI. The first pinned vertex is then assigned to a first vertex of the second single loop finite geometrical shape within the ROI, and then the process repeated for all remaining vertices of the first single loop finite geometrical shape.

Wherein the locations of the first and second vertices both reside outside the ROI, then a region of the mask matrix wherein the first vertex lies is determined followed by pinning such first vertex to the boundary of the ROI based upon the region of the mask matrix where it resides. In particular, if the first vertex resides within a region adjacent to a corner of the ROI, then the first vertex is pinned to a closest corner of the ROI. However, if the first vertex resides within a region adjacent to a lateral edge of the ROI, then the first vertex is pinned to a closest lateral edge of the ROI. The process is then repeated for all remaining vertices of the first single loop finite geometrical shape.

Once the first vertex is pinned to either a corner or lateral edge of the ROI, the lateral edge of the first single loop finite geometrical shape that joins the first and second vertices is located and then it is determined whether such joining edge intersects the ROI at two pinned points. If it is determined that the lateral edge intersects the ROI at two pinned points, then the first of such points is assigned to a first vertex of the second single loop finite geometrical shape, while the second of such points is assigned to a second vertex of the second single loop finite geometrical shape.

Alternatively, if it is determined that the lateral edge does not intersect the ROI at two pinned points, then it is determined whether the first and second vertices reside in the same region of the mask matrix. In so doing, if the first and second vertices reside in the same region, then the process is repeated for all remaining vertices of the first single loop finite geometrical shape. If it is determined that the first and second vertices do not reside in the same region, then it must be determined whether the first and second vertices reside in adjacent regions of the mask matrix. If the first and second vertices do reside in adjacent regions of the mask matrix, then the process is repeated for all remaining vertices. However, if it is determined that the first and second vertices do not reside in adjacent regions of the mask matrix, then it must be determined whether the first and second vertices in fact do not reside in adjacent regions of the mask matrix. If this determination provides a result that the first and second vertices are not, not residing in adjacent regions of the mask matrix, then the process is stopped due to an error in the computation. If it is determined that the first and second vertices in fact do not reside in adjacent regions of the mask matrix, then the lateral edge joining such first and second vertices must reside outside the ROI. As such, an additional vertex is added to the boundary of the ROI to a closest corner of such ROI with respect to the lateral edge joining the first and second vertices.

In a second aspect, the invention is directed to a method of performing model-based optical proximity correction by providing a mask matrix having a region of interest (ROI) with a boundary and locating a plurality of points of interest within the mask matrix. A first single loop polygon having a plurality of vertices representative of the located plurality of points of interest is then computed, and selected ones of the plurality of vertices are pinned to the boundary of the ROI to form a second single loop polygon on the ROI. These selected ones of the plurality of vertices are pinned to the ROI based on a spatial relation thereof with respect to the ROI, as discussed above. Optical proximity is then corrected for using this second single loop polygon.

In this aspect, those located plurality of points of interest are representative of a group of polygons within the mask matrix such that the plurality of vertices of the first single loop polygon are representative of all vertices of the group of polygons. The pinning steps of the second aspect of the invention are repeated for all vertices of the first single loop polygon such that the second single loop polygon is collapsed on the boundary of and within the ROI.

In a third aspect, the invention is directed to a program storage device readable by a machine, tangibly embodying a program of instructions executable by the machine to perform method steps for performing model-based optical proximity correction. These method steps include providing a mask matrix having a region of interest with a boundary and locating a plurality of points of interest within the mask matrix. A first single loop finite geometrical shape having a plurality of vertices representative of the located plurality of points of interest is then determined, and the first single loop finite geometrical shape is collapsed onto the ROI to correct for optical proximity.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
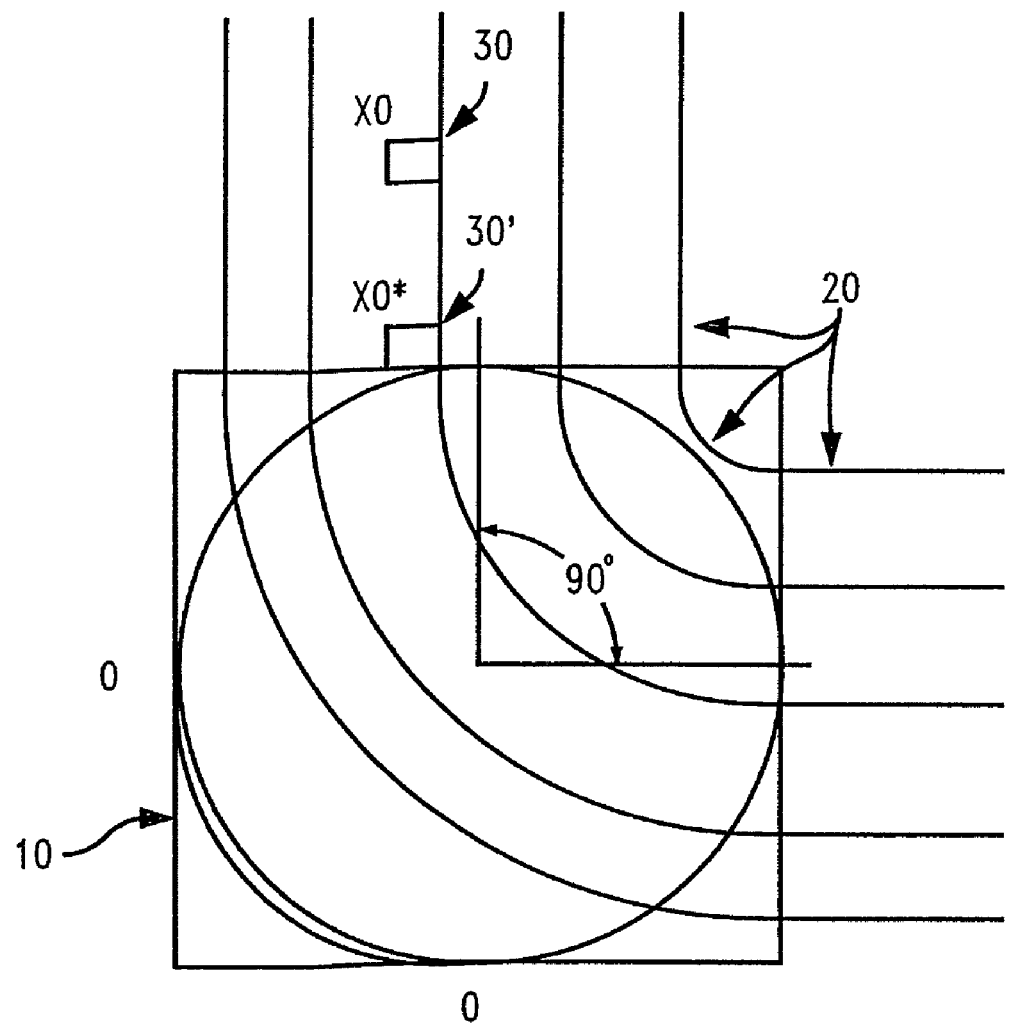
FIG. 1 is a prior art schematic illustration showing a sector based OPC engine decomposing a polygon into a collection of sectors of 90 degree angles for allowing the convolution over the sector to be pre-calculated as base-images stored in tables.
Figure 2A:
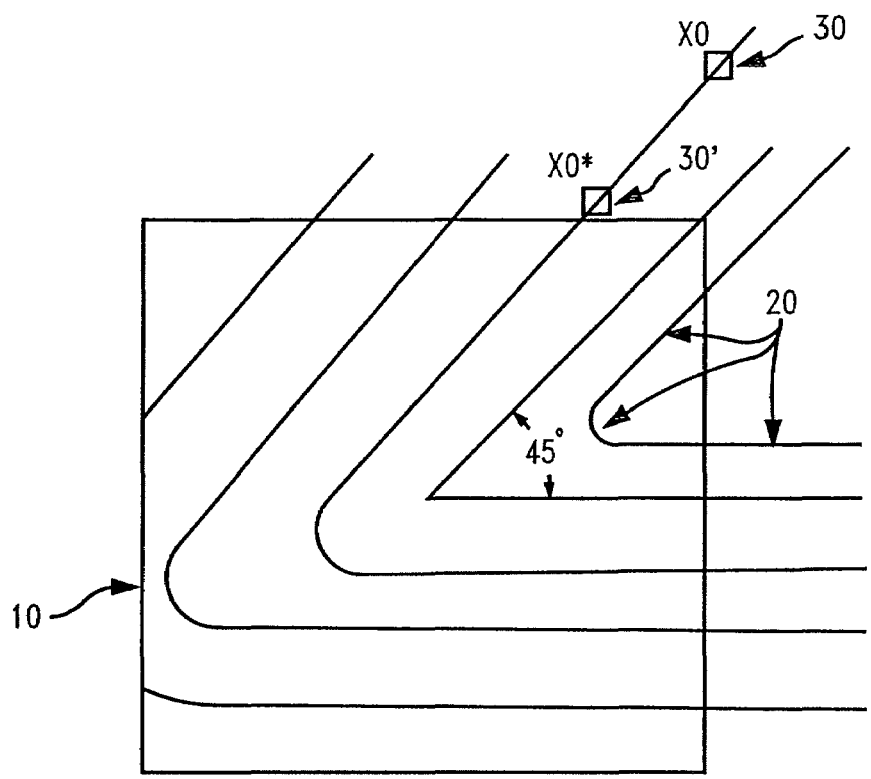
FIG. 2A is another prior art schematic illustration showing a sector based OPC engine decomposing a polygon into a collection of sectors of 45 degree angles for allowing the convolution over the sector to be pre-calculated as base-images which are stored in tables.
Figure 2B:
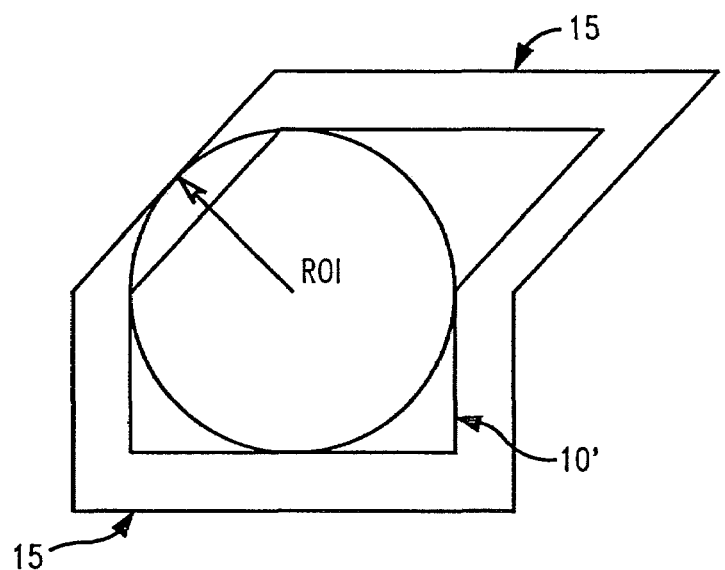
FIG. 2B is a prior art schematic illustration of FIG. 2A showing that the table look up area must be skewed in a similar manner as the region of interest to include certain x0 values.

In describing the preferred embodiment of the present invention, reference will be made herein to FIGS. 1-5 of the drawings in which like numerals refer to like features of the invention.

The present invention is directed to model-based optical proximity correction that initially locates a finite geometrical shape within a matrix having a region of interest (ROI) of a model-based simulation. The foregoing model-based optical proximity correction (OPC) is for use in optical lithography to ultimately correct for any distortions on a photomask having desired circuit patterns, for the accurate projection thereof onto photoresist-coated wafers.

It should be understood that the invention is suitable for use with any finite geometrical shape. In the preferred embodiment, the finite geometrical shape is a polygon. A polygon in a design is typically doffed by a set of vertex (vertices) and the corresponding sequence, for example by convention the left hand side of the forward moving edge may always be inside the polygon. In accordance with the invention, the polygon may be regular or irregular, convex or concave, or any combination thereof.

Further, the polygon may comprise any shape including, but not limited to, a triangle, quadrilateral (square, rectangle, parallelogram), pentagon, hexagon, heptagon, octagon, nonagon, decagon, and the like.

The present invention provides an improved algorithm and polygon pinning method for use in model-based OPC. Initially, the model-based simulation includes locating a plurality of points of interest that are representative of finite shape(s), such as representative of the vertices of a polygon or a group of polygons. These points may lie within a model-based mask matrix that includes a region of interest.

In order to sum the convolution contribution of these located polygons, the efficient polygon pinning method and algorithm of the invention calculates a single, closed loop polygon that has vertices representative of the plurality of located points of interest within the matrix, whether such located points be representative of a single polygon or a group of polygons within the matrix. Wherein the located points represent polygon(s) within the matrix, the computed closed loop polygon of the invention is significantly larger than all such polygons combined.

In accordance with the invention, the computed single, closed loop polygon is collapsed onto the boundaries of and/or within the ROI such that a second (i.e., collapsed) single, closed loop polygon is formed having vertices representative of the originally located points of interest (vertices) within the matrix. This collapsed polygon is collapsed onto the ROI by pinning those located points of interest that lie outside the ROI to the boundaries of and within the ROI such that all vertices of the collapsed polygon reside on the bounds of and within the ROI. This collapsed polygon is then used for the subsequent summation of the convolution contribution of the located points of interest for the ultimate correct of any distortion on a photomask.

Figure 3A:
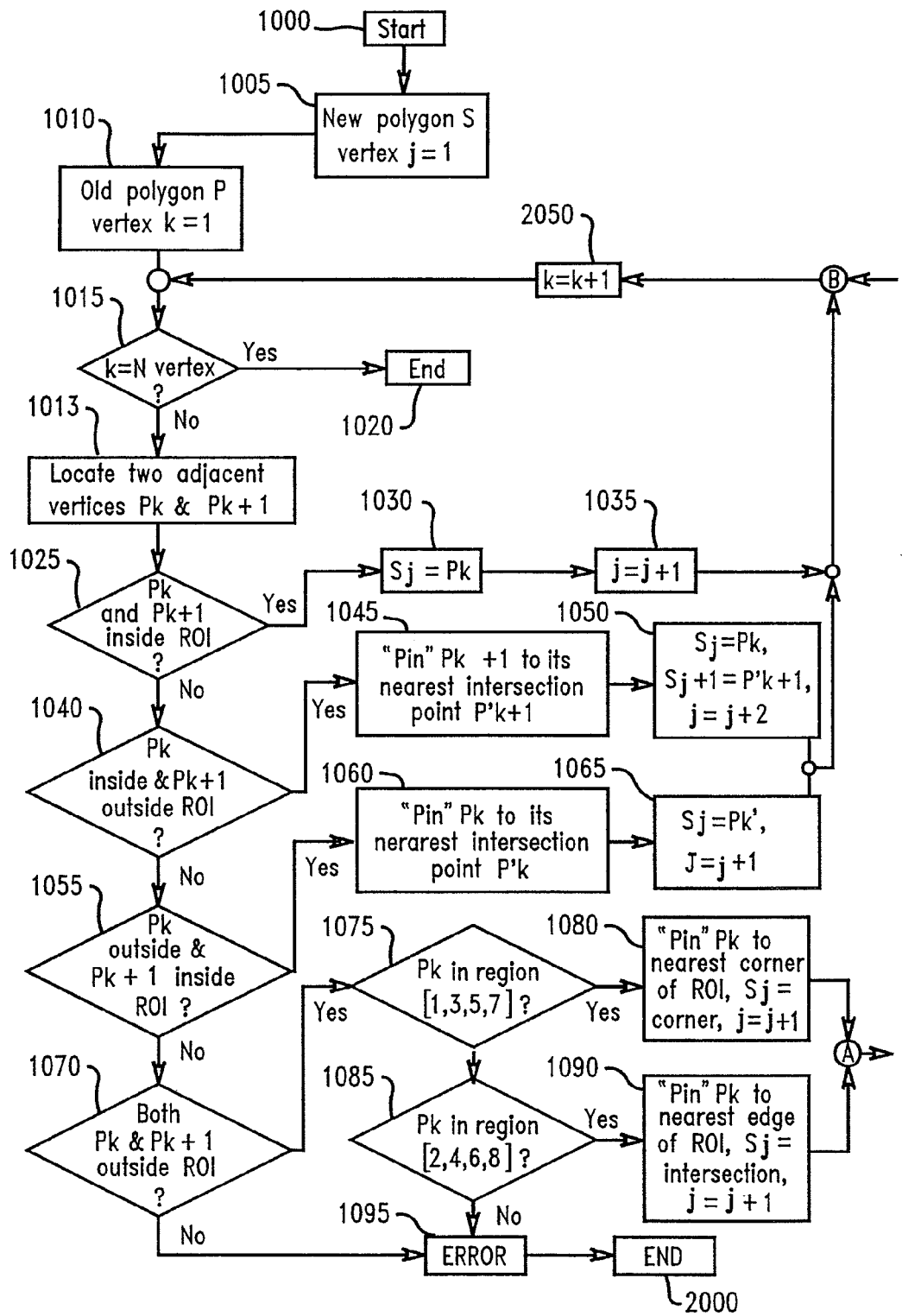
FIGS. 3A and 3B illustrate a block diagram flow chart of the preferred steps employed in practicing the present invention.
Figure 3B:
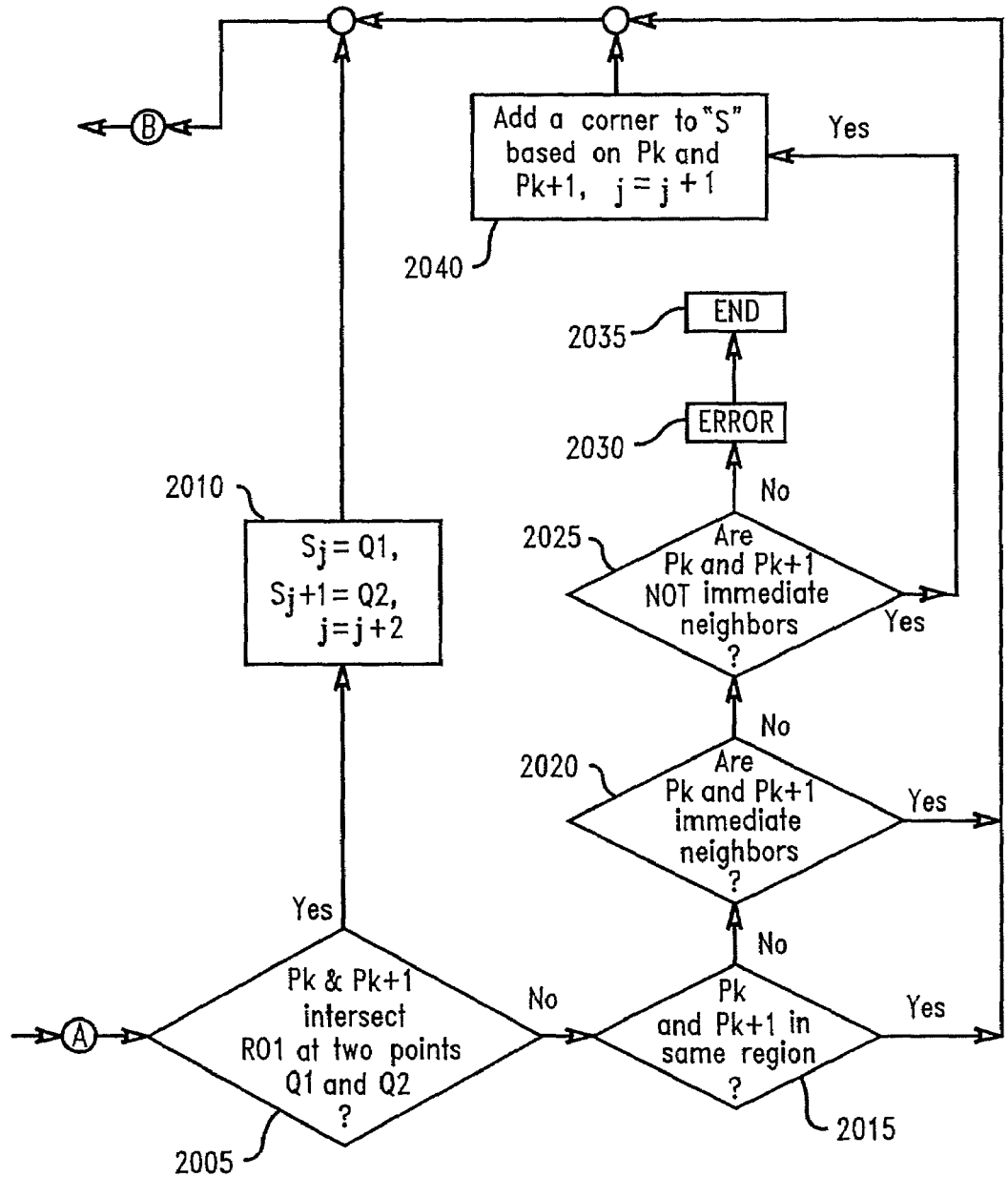

Referring to the drawings, the present single loop polygon and process flow of the invention will be better understood in accordance with the following description of the flow chart shown in FIGS. 3A and 3B, wherein letters in circles indicate connections to and from other parts of the flow chart.

Step 1000—Start. Start the process.

Step 1005—New polygon S vertex j=1. The new, collapsed single loop polygon "S" of the invention has a vertex of j=1.

Step 1010—Old polygon P vertex k=1. The originally computed polygon "P" within the matrix has a vertex of k=1.

Step 1015—K=Nvertex? Has the last vertex, i.e., point, of polygon "P" been reached? If yes, go to step 1020 and end the process. If no, go to step 1013 and continue the process.

Step 1020—END. End the process.

Step 1013—Locate two adjacent vertices, i.e., points, of polygon "P", namely, vertices Pk and Pk+1. Continue to step 1025.

Step 1025—Pk and Pk+1 inside ROI? Are the two adjacent vertices Pk and Pk+1 of polygon "P" both inside the ROI? If yes, go to step 1030. If no, go to step 1040.

Step 1030—Sj=Pk. Assign Pk to Sj. Continue to step 1035.

Step 1035—j=j+1. Go to next vertex of Polygon P. Continue to step 2050.

Step 1040—Pk inside & Pk+1 outside ROI? Is the vertex Pk of polygon "P" inside the ROI and the vertex Pk+1 of polygon "P" outside the ROI? If yes, go to step 1045. If no, go to step 1055.

Step 1045—"Pin" Pk+1 to its nearest intersection point P'k+1 with the boundary of the ROI. Continue to step 1050.

Step 1050—Sj=Pk, Sj+1=P'k+1, j=j+2. Continue to step 2050.

Step 1055—Pk outside & Pk+1 inside ROI? Is the vertex Pk of polygon "P" outside the ROI and the vertex Pk+1 of polygon "P" inside the ROI? If yes, go to step 1060. If no, go to step 1070.

Step 1060—"Pin" Pk to its nearest intersection point P'k with the ROI boundary. Continue to step 1065.

Step 1065—Sj=Pk', j=j+1. Assign P'k to Sj, then, go to next vertex of polygon "P" by continuing to step 2050.

Step 1070—Both Pk & Pk+1 outside ROI? Are the vertices Pk and Pk+1 of original polygon "P" both outside the ROI? If yes, go to step 1075. If no, go to step 1095.

Step 1075—Pk in region [1, 3, 5, 7]? Is the vertex Pk of original polygon "P" within regions 1, 3, 5, or 7 of the matrix? If yes, go to step 1080. If no, go to step 1085.

Step 1080—Corner_pin Pk to nearest corner of ROI, Sj=corner, j=j+1. Pk is in either regions 1, 3, 5 or 7 of the matrix, therefore, pin Pk to the nearest corner of the ROI (see, FIG. 5). Continue to step 2005.

Step 1085—Pk in region [2, 4, 6, 8]? Is the vertex Pk of original polygon "P" within regions 2, 4, 6 or 8 of the matrix? If yes, go to step 1090. If no, go to step 1095.

Step 1090—Ortho_pin Pk to nearest edge of ROI, Sj=intersection, j=j+1. Pk is in either region 2, 4, 6 or 8 of the matrix, therefore, pin Pk to the closest ROI boundary, in a direction perpendicular to the boundary edge (see, FIG. 5). Continue to step 2005.

Step 1095—ERROR. There is an error in the calculation. Go to step 2000 and end the process.

Step 2000—END. End the process.

Figure 4A:
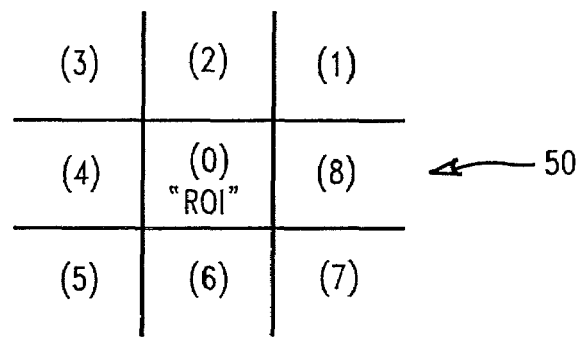
FIG. 4A is a schematic of the present invention showing a model of a mask matrix having a plurality of regions, including a region of interest, for use in the process flow depicted in FIG. 3 for sector based OPC.
Figure 4B:
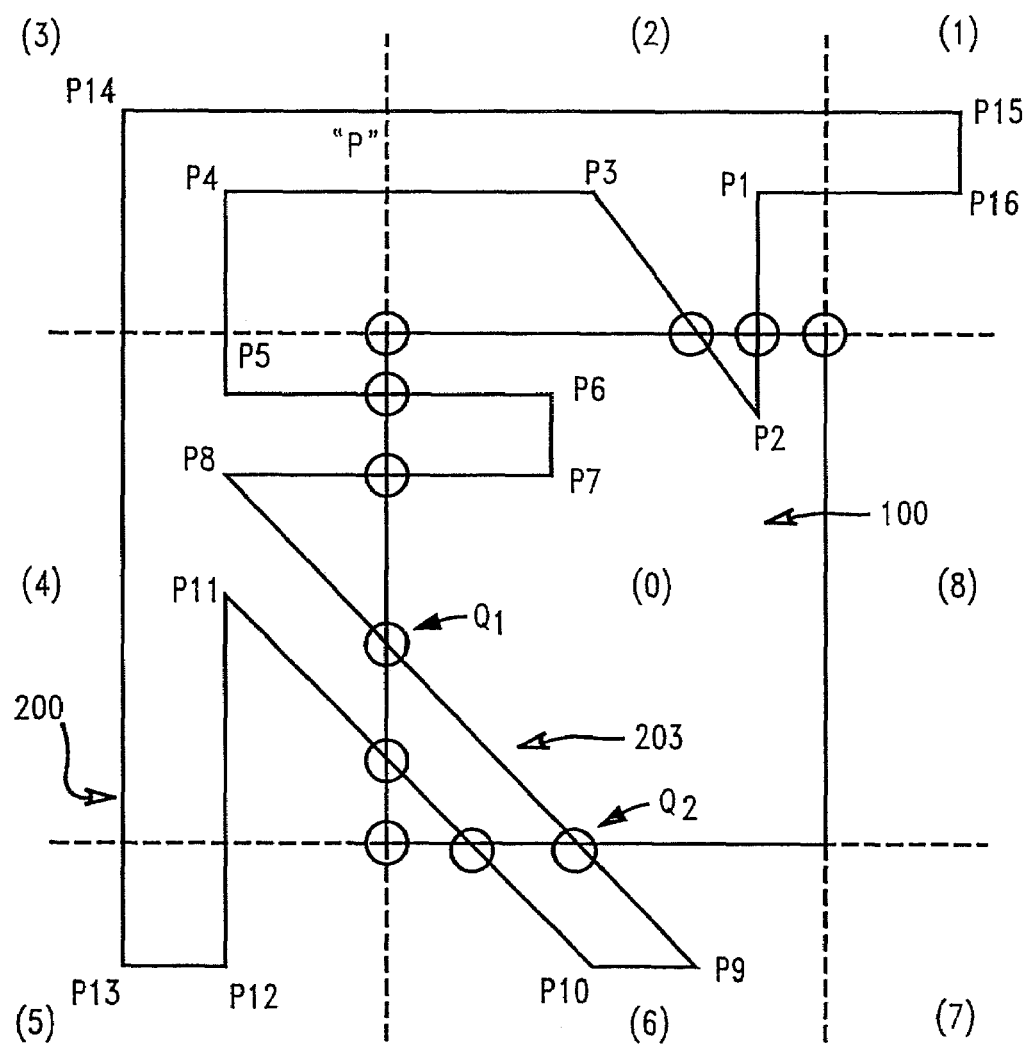
FIG. 4B is a schematic of the present invention showing the step of locating points of interest and calculating a large single loop polygon for 90-degree sectors having a number of vertices that are representative of the located points of interest within the matrix of FIG. 4A.

Step 2005—Pk & Pk+1 intersect ROI at two points Q1 and Q2? Does the lateral edge of polygon P that joins vertices Pk and Pk+1 intersect the ROI at two points, namely, Q1 and Q2? (See, FIG. 4B wherein the lateral edge 203 of polygon P for vertices P8 and P9 intersects the ROI (0) at two points Q1 and Q2.) If yes, then go to step 2010. If no, go to step 2015.

Step 2010—Sj=Q1, Sj+1=Q2, j=j+2. Assign Q1 to Sj and Q2 to Sj+1, then increase vertex index of S by 2. Go to step 2050.

Step 2015—Pk and Pk+1 in same region? Are the vertices Pk and Pk+1 in the same region of the mask matrix? If yes, go to step 2050. If no, go to step 2020.

Step 2020—Are Pk and Pk+1 immediate neighbors? If vertices Pk and Pk+1 are not within the same region of the mask matrix, then are they in immediate neighboring regions of the matrix that share at least one side with each other (except for the ROI side)? If yes, go to step 2050. If no, go to step 2020.

Step 2025—Are Pk and Pk+1 NOT immediate neighbors? Are vertices Pk and Pk+1 NOT in immediate neighboring regions of the mask matrix? If yes, go to step 2040. If no, go to step 2030.

Step 2030—ERROR. There is an error in the calculation. Go to step 2035 and end the process.

Step 2035—END. End the process.

Step 2040—Add_corner (Pk, Pk+1). If the sector intersections of vertices Pk and Pk+1 are outside of the ROI (see sector segments [3,4], [7,8], [8,9] in FIG. 5), then a vertex is added at the corner of the ROI, j=j+1. Continue to step 2050.

Step 2050—k=k+1. Go to next vertex of polygon "P". Continue to step 1015.

In the preferred embodiment, the present single loop polygon and above process flow are best represented by the below pseudo-code pinning algorithm of the invention:

```
For k=1 to Num_vertex-1
    If Pk is in and Pk+1 is in,
        Sj=Pk, j=j+1
    Else If Pk is in and Pk+1 is out,
        pin Pk+1 to its nearest intersection →Pk+1'
        Sj=Pk,
        Sj+1=intersection, j=j+2
    Else If Pk is out and Pk+1 is in
        pin Pk to its nearest intersection→Pk'
        Sj=Pk', j=j+1
    Else if Pk is out and Pk+1 is out
        If Pk is in region [1,3,5,7]
            Sj=corner_pin (Pk),j=j+1
        Else if Pk is region [2,4,6,8]
            Sj=ortho_pin (Pk),j=j+1
        If Pk, Pk+1intersect ROI at 2 pts Q1,Q2
            Sj=Q1,
            Sj+1=Q2, j=j+2
        Else if Pk and Pk+1 are in same region
            No action
        Else if Pk and Pk+1 are immediate neighbor
            No action
        Else if Pk and Pk+1 are not in immediate neighbor region
            Sj=add_corner( Pk,Pk+1), j=j+1
        Else Error
    Else
        Error
End
END
```

An advantage of the invention is that the present process flow and pinning algorithm enable the calculation of a large single loop polygon from any degree angle sectors for a number of points simultaneously. This polygon is then collapsed onto the ROI, by pinning of vertices thereof, for the subsequent summation of convolution contribution of this collapsed polygon, which is representative of the originally located points of interest, i.e., the vertices of the located finite geometrical shapes within the mask matrix.

Referring now to FIGS. 4A-D the present process flow and pinning algorithm are illustrated for a variety of 90-degree sectors for various points referred to as reference numerals P1 through P16 within a mask matrix 50 having a predetermined number of regions or divisions. For example, as shown in FIG. 4A, the mask space or matrix 50 is divided into nine regions numbered region (0) through region (8). However, it should be recognized that the invention is not limited to dividing the mask into nine regions, but may be used with as many mask divisions as required for the ultimate correction of any distortion on the desired photomask. Further, the mask division is shown as quadrilaterals, however, it should also be recognized that the mask may be divided into any finite geometrical division as known and used in the art.

As shown in FIG. 4B, the mask space is illustrated, via delineation of dashed lines, having regions (0) through region (8). The area of interest for the present model-based OPC technique is region (0), as shown by reference numeral 100, which is referred to as the region of interest "ROI." Initially, at least one finite geometrical shape, such as a polygon, or alternatively a plurality of finite geometrical shapes (polygons), are located within the mask matrix 50. In so doing, a number of points of interest, e.g., P1 through P16, are located whereby these points are representative of all vertices of all located finite geometrical shape(s). As shown in FIG. 4B, some of these points lie within the ROI 100 (e.g., P2, P6 and P7), while others of such points lie outside the ROI (e.g., P1, P3, P4, P5 and P8 through P16). Those points that lie outside the ROI reside within various other regions of the mask matrix 50. For example, as shown in FIG. 4B, points P15 and P16 lie within region 1, points P1 and P3, lie within region 2, and so forth.

Using the plurality of points P1 through P16 within the mask matrix, a large single loop polygon "P" 200 having any finite geometrical shape is calculated using the pinning algorithm of the invention. In so doing, the finite geometrical shape of polygon "P" 200 has a plurality of vertices representative of the number of located points of interest, i.e., P1 through P16, whereby each vertex of the polygon "P" 200 is representative of at least one of such points. Those regions of the mask matrix that have no points of interest therein will not contribute to the convolution of the polygon. For example, as shown in FIG. 4B, regions (7) and (8) have no points therein, and therefore, the polygon 200 does not extend to these regions such that there will be no subsequent contribution from regions (7) and (8).

Figure 4C:
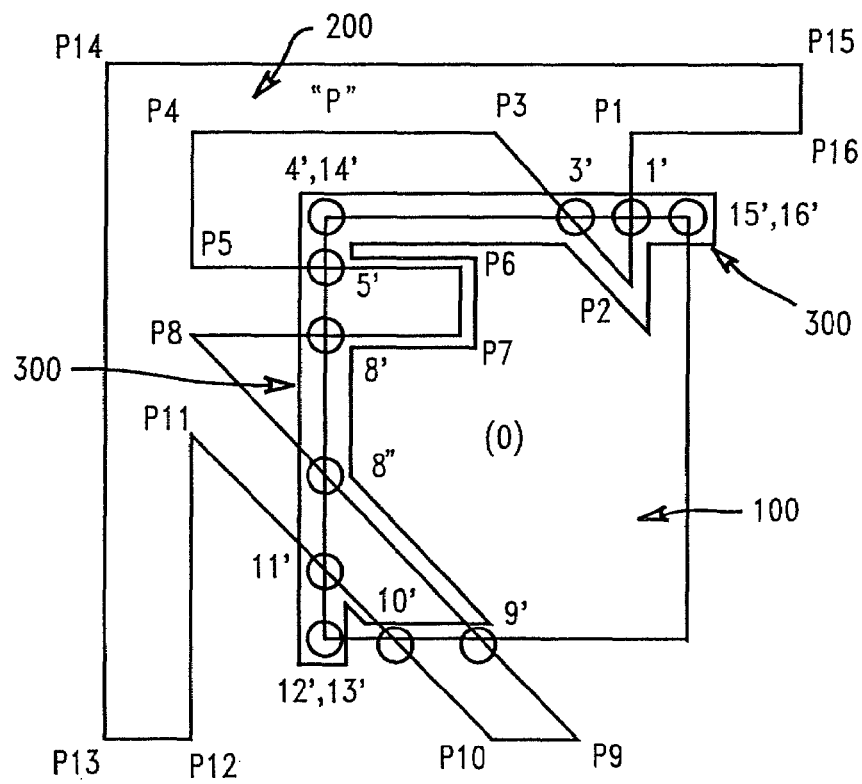
FIG. 4C is a schematic of the present invention showing the step of collapsing the large single loop polygon of FIG. 4B onto the boundaries of and within the ROI.
Figure 4D:
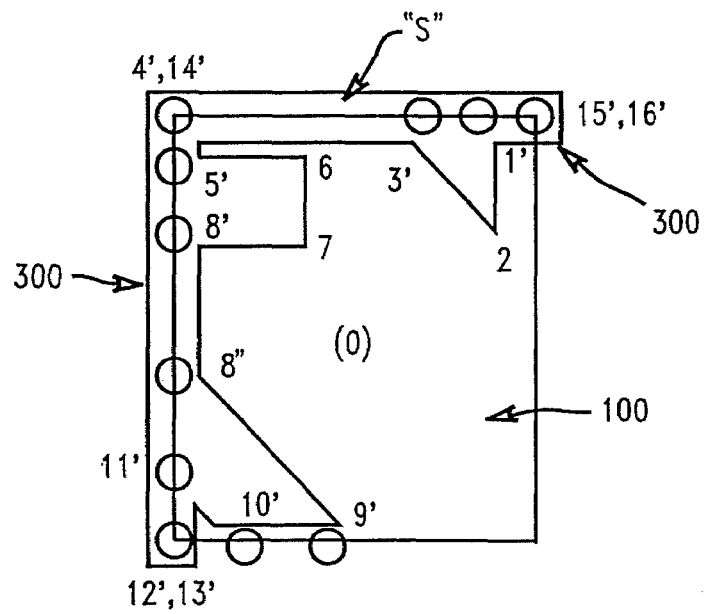
FIG. 4D is a schematic of the present invention showing the new collapsed single loop polygon of FIG. 4C residing on the boundaries of and within the ROI.

Once the large single loop polygon "P" 200 is calculated and formed, it is collapsed onto the boundaries of the ROI 100 as shown in FIGS. 4C-D. In collapsing the polygon "P" 200, the polygon "P" 200 is convoluted onto the surface of the ROI or onto the boundaries of and within the ROI (0) 100 such that a new polygon "S" 300 is formed. This collapsed polygon "S" 300 is formed along the boundaries and/or within the ROI 100 such that it may, or may not, have the same finite geometrical shape as the original polygon "P" 200. Further, the original polygon "P" 200 and the collapsed polygon "S" 300 may have the same, or a different, number of vertices. For example, as shown in FIGS. 4C-D, the polygon "S" 300 illustrated therein has vertices 1' through 8', 8" and 9' through 16' (seventeen vertices) that are representative of vertices P1 through P16 (sixteen vertices) of polygon "P" 200. In so doing, all vertices that were formerly outside of the ROI are now collapsed onto the boundaries of the ROI and all vertices that originally resided within the ROI are not changed.

Polygon "S" 300 is collapsed by pinning all located points that reside outside the ROI 100 to the boundaries of and within the ROI (0). In so doing, a critical feature of the invention is that those points that originally resided outside the ROI 100 merge together, or overlap, in the new polygon "S" 300 while maintaining the closed single loop polygon feature of the invention.

However, for ease of understanding the invention, all points except P2, P6 and P7, which originally resided within ROI (0) 100, are pinned onto the ROI boundary in new polygon "S" 300, are shown as separate points in FIGS. 4C-D to merely illustrate the single, closed loop feature of collapsed polygon "S" 300. The pinning together of any original points outside the ROI and the single closed loop feature of polygon "S" 300 are essential to the invention as they avoid the need to break the large closed loop polygon 200 into smaller polygons within the ROI, and therefore, advantageously preserve the hierarchy and data contained within the large closed loop polygon 200. This, in turn, significantly improves numerical stability by reducing processing overhead.

Once all vertices of the calculated polygon "P" are pinned to the boundaries of and within ROI, the collapsed closed single loop polygon "S" 300 is formed. In so doing, the collapsed polygon may not preserve the number of vertices of the original polygon "P" 200, i.e., it does not maintain vertices P1 through P16. The new collapsed polygon "S" 300 may have a larger number of vertices "#", or alternatively a smaller number of vertices, in comparison to the number of vertices "P#" of the original large polygon "P" 200. That is, with respect to the above pseudo-code of the invention, the originally computed large single loop polygon "P" has vertices Pk, wherein k=1, 2, 3, . . . Nvertex, while the collapsed single loop polygon "S" has vertices Sk, wherein k=1, 2, 3, . . . Nvertex, and wherein Pk and Sk may be identical or not identical. Referring to FIGS. 4C-D, the collapsed polygon "S" 300 has more vertices than the original large polygon "P" 200. In particular, the vertex P8 of polygon "P" 200 is pinned to the ROI boundary at two different locations 8' and 8'. This is essential to ensure that the portion of Pk for convolution that lies inside the ROI remains unchanged.

Convolution of the collapsed polygon "S" 300 with the kernel may then be performed to obtain the desired result. This may be accomplished by summing up the contribution from each 90-degree sector only from within or on the boundary of the ROI (0). Any points lying outside of the ROI (0) 100 do not add any convolution contribution to the polygon.

Figure 5:
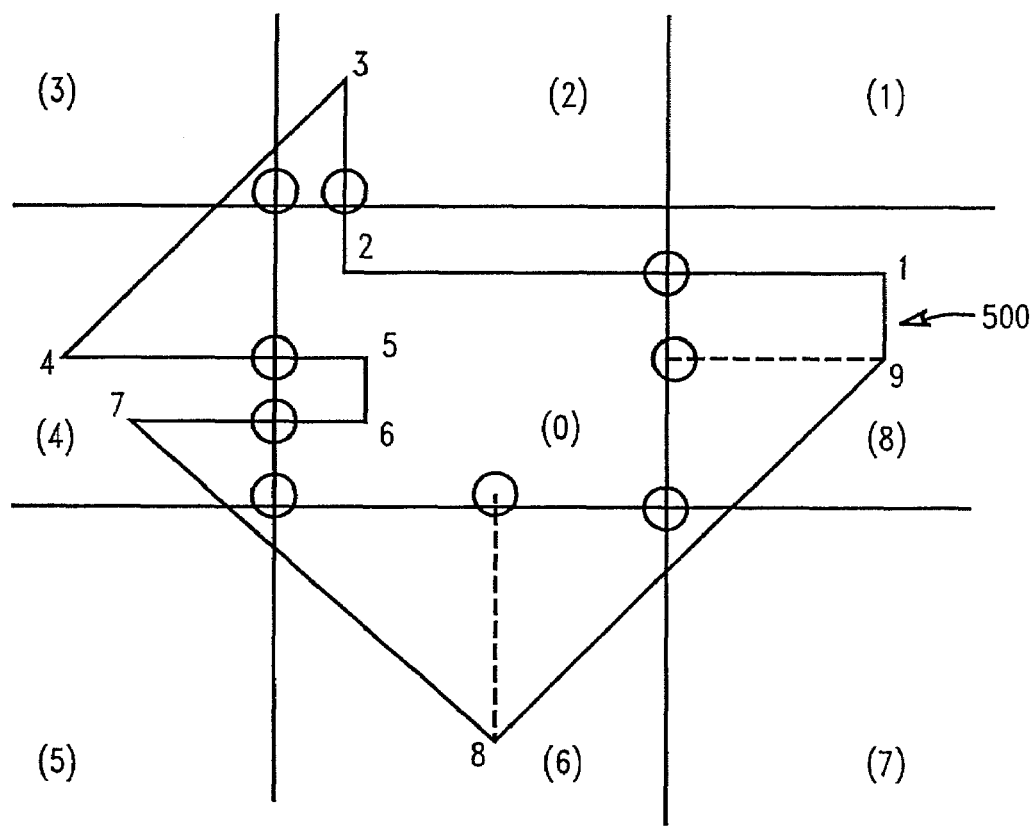
FIG. 5 is a schematic of an alternate embodiment of the invention showing the step of locating points of interest and calculating a large single loop polygon for 45-degree sectors having a number of vertices that are representative of located points of interest within the matrix of FIG. 4A.

Referring to FIG. 5, the present process flow and pinning algorithm are illustrated for 45-degree sectors for various points P1 through P8 within the mask matrix 50. Again, the mask matrix 50 has regions (0) through (8), whereby region (0) is the region of interest. As is shown, all points of interest P1 through P9 are located within the mask matrix 50. A large single loop polygon 500 is calculated in accordance with the invention to represent all of such located points of interest P1 through P9. In so doing, the vertices of this single loop polygon 500 represent the points of interest P1 through P9, whereby selected ones of such vertices reside at 45 degree sectors, such as vertices P3, P4 and P8. With respect to each 45 degree sector, if it is determined that its sector intersections with the ROI (0) lies outside of the ROI (0), then a vertex is added to the corner of the ROI.

An advantage is that the present method and algorithm for OPC analyze polygons edge by edge, particularly from one lateral edge of the polygon to a next adjacent lateral edge of such polygon. This is particularly useful for those polygons having 45-degree sectors. An essential feature is that the 45-degree line preserves its slope after collapsing of the large polygon 500 to the boundary of and within the ROI by pinning of the vertices, while simultaneously maintaining the single loop polygon feature of the invention. The pinned vertices are denoted in FIG. 5 as circles along the boundary of the ROI (0). Another advantage of the present invention with respect to 45-degree sectors is that it avoids the need for a skewed table In all aspects of the invention, the present pinning method and algorithm for use in OPC also facilitates the use of triangle convolution as disclosed in U.S. Pat. No. 7,010,776, titled "EXTENDING THE RANGE OF LITHOGRAPHIC SIMULATION INTEGRALS"), which does not require that the kernel be spatially truncated, but rather, that the mask be truncated into a square area with a size of $(2 \times ROI)^2$. That is, the table memory size in the present invention may be advantageously reduced to within $(2 \times ROI)^2$, even for 45-degree sectors (a benefit of eliminating skewed tables).

In view of the foregoing description, the present invention does not introduce extra complexity over conventional kernel truncation approaches. The present pinning algorithm offers the advantage of speeding-up the convolution process by providing an algorithm that enables multiple point convolutions done within a single search for polygons within the ROI. A critical feature of the invention is that the new collapsed polygon "S" is formed that may have segments of zero width while still maintaining a single closed loop polygon. That is, as discussed above, any overlapping edges within the ROI will have their sector convolution canceled upon completion of the collapsed single closed loop polygon of the invention. Further, the present method and algorithm have the advantage of maintaining the polarity of the originally calculated polygon "P" even after additional vertices (8") have been added to the ROI as a result of the collapsed polygon "S".

Further, the invention advantageously avoids the need for, and creation of, a number of smaller polygons that are partially inside the ROI and representative of those located polygons, which is typical with conventional cropping model-based OPC techniques. In accordance with the invention, all initially located points of interest are pinned so as to reside on the boundaries of or within the ROI (0). In so doing, the invention provides for an efficient OPC computation that saves a significant amount of processing and computation time, as well as significantly reduces processing steps, topological overhead and numerical instability associated with conventional OPC techniques. The amount of memory required for the present OPC technique and algorithm is also significantly reduced as the invention avoids the need for the time consuming and tedious task of maintaining a book-keeping on a hierarchy of a group of smaller polygons (derived from breaking a larger polygon) to expand a table lookup, avoids the need for a skewed table or coordinate transformation during the table lookup, as well as avoids the need for any continuation convention within a table lookup.

The method may be implemented through a computer program product stored on a program storage device that is readable by a machine and tangibly embodies a program of instructions executable by the machine to perform each of the method steps. The program storage devices of the present invention may be devised, made and used as a component of a machine utilizing optics, magnetic properties and/or electronics to perform the method steps of the present invention. Program storage devices include, but are not limited to, magnetic diskettes, magnetic tapes, optical disks, Read Only Memory (ROM), floppy disks, semiconductor chips and the like. A computer readable program code means in known source code may be employed to convert the methods described above for use on a computer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of performing model-based optical proximity correction comprising:
    providing a mask matrix having a region of interest (ROI) with a boundary;
    locating a plurality of points of interest within said mask matrix;
    determining a first single loop polygon having a finite geometrical shape with a plurality of vertices representative of said located plurality of points of interest; and
    collapsing said first single loop polygon onto said ROI using an algorithm to form a second single loop polygon residing within said ROI to correct for optical proximity, said second single loop polygon formed by locating and determining locations of at least first and second vertices of said first single loop polygon in relation to said ROI, wherein if said locations comprise said first vertex residing within said ROI and said second vertex residing outside said ROI, the method including the steps of:
        pinning said second vertex to a closest point of intersection with said boundary of said ROI using said algorithm;
        assigning said first vertex to a first vertex of said second single loop polygon;
        assigning said pinned second vertex to a second vertex of said second single loop polygon;
        repeating said steps for all vertices of said first single loop finite geometrical shape;
        generating said second single loop polygon using said assigned vertices such that all vertices of said second single loop polygon residing within said ROI.

2. The method of claim 1 wherein said first and second single loop polygons have identical finite geometrical shapes.

3. The method of claim 1 wherein said first and second single loop polygons have different finite geometrical shapes.

4. The method of claim 1 wherein said first and second single loop polygons have an identical number of vertices.

5. The method of claim 1 wherein said first and second single loop polygons have a different number of vertices.

6. The method of claim 1 wherein said step of determining said first single loop polygon comprises computing said first single loop polygon based on a correlation between said plurality of points of interest and said ROI.

7. The method of claim 1 wherein said first and second vertices are adjacent to each other, and are respectively representative of adjacent first and second points of interest of said plurality of points of interest within said mask matrix.

8. A method of performing model-based optical proximity correction comprising:
    providing a mask matrix having a ROI with a boundary;
    locating a plurality of points of interest within said mask matrix;
    determining a first single loop polygon having a finite geometrical shape with a plurality of vertices representative of said located plurality of points of interest;
    collapsing said first single loop polygon onto said ROI using an algorithm to form a second single loop polygon residing within said ROI to correct for optical proximity, said second single loop polygon formed by locating and determining locations of at least first and second vertices of said first single loop polygon in relation to said ROI, wherein if said location comprises said first vertex residing outside said ROI and said second vertex residing within said ROI, the method including the steps of:
        pinning said first vertex to a closest point of intersection with said boundary of said ROI using said algorithm;
        assigning said first pinned vertex to a first vertex of said second single loop polygon within said ROI; and
        repeating said steps for all vertices of said first single loop polygon
        generating said second single loop polygon using at least said assigned vertices such that all vertices of said second single loop polygon residing within said ROI.

9. A method of performing model-based optical proximity correction comprising:
    providing a mask matrix having a ROI with a boundary;
    locating a plurality of points of interest within said mask matrix;
    determining a first single loop polygon having a finite geometrical shape with a plurality of vertices representative of said located plurality of points of interest;
    collapsing said first single loop polygon onto said ROI using an algorithm to form a second single loop polygon residing within said ROI to correct for optical proximity, said second single loop polygon formed by locating and determining locations of at least first and second vertices of said first single loop polygon in relation to said ROI, wherein if both said first and second vertices reside outside said ROI the method including the steps of;
        determining a region of said mask matrix wherein said location of said first vertex resides;
        pinning said first vertex to said boundary of said ROI based upon said region of said mask matrix where said first vertex resides, wherein:
            if said first vertex resides within a region adjacent to a corner of said ROI, pinning said first vertex to a closest corner of said ROI, if said first vertex resides within a region adjacent to a lateral edge of said ROI, pinning said first vertex to a closest lateral edge of said ROI; and repeating said steps for all vertices of said first single loop polygon to correct for optical proximity.

10. The method of claim 9 further including the steps of:

locating a lateral edge of said first single loop finite geometrical shape joining said first and second vertices; and determining whether said lateral edge intersects said ROI at two pinned points.

11. The method of claim 10 wherein it is determined that said lateral edge intersects said ROI at two points, the method further including the steps of:

assigning a first of said two pinned points to a first vertex of said second single loop finite geometrical shape within said ROI; and assigning a second of said two pinned points to a second vertex of said second single loop finite geometrical shape within said ROI.

12. The method of claim 10 wherein it is determined that said lateral edge does not intersect said ROI at two points, the method further including determining whether said first and second vertices reside in the same region of said mask matrix.

13. The method of claim 12 further including the steps, wherein;

if said first and second vertices reside in the same region, proceeding to said step of repeating said steps for all vertices of said first single loop finite geometrical shape, if said first and second vertices do not reside in the same region, determining whether said first and second vertices reside in adjacent regions of said mask matrix.

14. The method of claim 13 further including the steps, wherein;

if said first and second vertices reside in adjacent regions of said mask matrix, proceeding to said step of repeating said steps for all vertices of said first single loop finite geometrical shape, if said first and second vertices do not reside in adjacent regions of said mask matrix, determining whether said first and second vertices do not reside in adjacent regions of said mask matrix.

15. The method of claim 14 further including the steps, wherein;

if it is determined that said first and second vertices are not, not residing in adjacent regions of said mask matrix, stopping said method due to an error, if it is determined that said first and second vertices do not reside in adjacent regions of said mask matrix, then said lateral edge joining said first and second vertices resides outside said ROI and the method further includes the step of:

adding an additional vertex to a closest corner, with respect to said lateral edge joining said first and second vertices, of said boundary of said ROI.

16. A method of performing model-based optical proximity correction comprising:

providing a mask matrix having a region of interest (ROI) with a boundary;

locating a plurality of points of interest within said mask matrix;

computing a first single loop polygon having a plurality of vertices representative of said located plurality of points of interest;

pinning selected vertices of said plurality of vertices of said first single loop polygon to said boundary of said ROI to form a second single loop polygon on said ROI, said selected vertices of said plurality of vertices being pinned to said ROI based on a spatial relation of said selected vertices of said plurality of vertices with said ROI by:

locating first and second adjacent vertices of said first single loop polygon;

determining a location of each said first and second vertices within said matrix in relation to said ROI;

assigning said first vertex to a first vertex of said second single loop polygon when said locations of both said first and second vertices reside within said ROI; and correcting for optical proximity using said second single loop polygon.

17. The method of claim 16 wherein said located plurality of points of interest are representative of a group of polygons within said mask matrix such that said plurality of vertices of said first single loop polygon are representative of all vertices of said group of polygons.

18. The method of claim 16 wherein said location comprises said first vertex residing within said ROI and said second vertex residing outside said ROI, the method further including the steps of:

pinning said second vertex to a closest point of intersection with said boundary of said ROI;

assigning said first vertex to a first vertex of said second single loop polygon; and assigning said second pinned vertex to a second vertex of said second single loop polygon.

19. The method of claim 18 wherein said location comprises said first vertex residing outside said ROI and said second vertex residing within said ROI, the method further including the steps of:

pinning said first vertex to a closest point of intersection with said boundary of said ROI; and assigning said first pinned vertex to a first vertex of said second single loop polygon.

20. The method of claim 19 wherein said location comprises both said first and second vertices residing outside said ROI, the method further including the steps of:

determining a region of said mask matrix wherein said location of said first vertex resides;

pinning said first vertex to said boundary of said ROI based upon said region of said mask matrix where said first vertex resides, wherein:

if said first vertex resides within a region adjacent to a corner of said ROI, pinning said first vertex to a closest corner of said ROI, if said first vertex resides within a region adjacent to a lateral edge of said ROI, pinning said first vertex to a closest lateral edge of said ROI;

locating a lateral edge of said first single loop polygon joining said first and second vertices; and determining whether said lateral edge intersects said ROI at two points.

21. The method of claim 20 wherein it is determined that said lateral edge intersects said ROI at two points, the method further including the steps of:

assigning a first of said two pinned points to a first vertex of said second single loop polygon on said ROI; and assigning a second of said two pinned points to a second vertex of said second single loop polygon on said ROI.

22. The method of claim 21 wherein it is determined that said lateral edge does not intersect said ROI at two points, the method further including determining whether said first and second vertices reside in the same region of said mask matrix and;
  wherein said first and second vertices reside in the same region,
  locating a third vertex of said first single loop polygon,
  repeating said steps for said second and third vertices of said first single loop polygon;
  wherein said first and second vertices do not reside in the same region;
  determining whether said first and second vertices reside in adjacent regions of said mask matrix.

23. The method of claim 22 further including steps selected from the group of steps consisting of:
  a) if it is determined that said first and second vertices do reside in adjacent regions of said mask matrix, proceeding to said second and third vertices of said first single loop polygon, and repeating said steps; and
  b) if it is determined that said first and second vertices do not reside in adjacent regions of said mask matrix, determining whether said first and second vertices in fact do not reside in adjacent regions of said mask matrix;
    if it is determined that said first and second vertices are not, not residing in adjacent regions of said mask matrix, stopping said method due to an error; and
    if it is determined that said first and second vertices in fact do not reside in adjacent regions of said mask matrix, then said lateral edge joining said first and second vertices resides outside said ROI and the method further includes the step of:
      adding an additional vertex to said second single loop polygon at a corner of said boundary of said ROI, said corner being a closest corner to said lateral edge.

24. The method of claim 23 further including repeating said steps for all vertices of said first single loop polygon such that said second single loop polygon is collapsed on said boundary of and within said ROI.

25. A program storage device readable by a machine, tangibly embodying a program of instructions executable by the machine to perform method steps for performing model-based optical proximity correction, said method steps comprising:
  providing a mask matrix having a region of interest (ROI) with a boundary;
  locating a plurality of points of interest within said mask matrix;
  computing a first single loop polygon having a plurality of vertices representative of said located plurality of points of interest;
  using an algorithm, pinning selected vertices of said plurality of vertices of said first single loop polygon to said boundary of said ROI to form a second single loop polygon on said ROI, said selected vertices of said plurality of vertices being pinned to said ROI based on a spatial relation of said selected vertices of said plurality of vertices with said ROI by:
    locating first and second adjacent vertices of said first single loop polygon;
    determining a location of each said first and second vertices within said matrix in relation to said ROI;
    assigning said first vertex to a first vertex of said second single loop polygon when said locations of both said first and second vertices reside within said ROI; and
  correcting for optical proximity using said second single loop polygon.

* * * * *